(12) United States Patent
Best et al.

(10) Patent No.: US 7,393,248 B2
(45) Date of Patent: Jul. 1, 2008

(54) MODULAR POWER CONTROL SYSTEM WITH MULTIPIN CONNECTORS AND AIRFLOW CONROL MODULE

(75) Inventors: David Mark Best, Federal Way, WA (US); John A. Hansen, Renton, WA (US); David R. Jones, Maple Valley, WA (US); Artoush Safarli, Newcastle, WA (US); Jimmie L. Thomas, Federal Way, WA (US); Neill P. Smith, Mt. Vernon, WA (US)

(73) Assignee: The Boeing Company, Chicago, IL (US)

( * ) Notice: Subject to any disclaimer, the term of this patent is extended or adjusted under 35 U.S.C. 154(b) by 77 days.

(21) Appl. No.: 11/556,647

(22) Filed: Nov. 3, 2006

(65) Prior Publication Data

US 2008/0122289 A1    May 29, 2008

(51) Int. Cl.
*H01R 25/00* (2006.01)
(52) U.S. Cl. .................................................... 439/638
(58) Field of Classification Search ................ 439/638, 439/639, 214, 540.1, 216, 502, 500; 174/149 B; 307/141
See application file for complete search history.

(56) References Cited

U.S. PATENT DOCUMENTS

| | | | | |
|---|---|---|---|---|
| 4,502,744 A * | 3/1985 | Garnett et al. | ................ | 439/92 |
| 4,789,792 A * | 12/1988 | Ruedi | .......................... | 307/141 |
| 5,390,081 A * | 2/1995 | St. Pierre | ..................... | 361/775 |
| 5,570,002 A * | 10/1996 | Castleman | ................... | 323/283 |
| 5,779,499 A * | 7/1998 | Sette et al. | ............... | 439/540.1 |
| 6,086,397 A * | 7/2000 | Chapman et al. | ............ | 439/214 |
| 6,486,407 B1 * | 11/2002 | Hawker et al. | .......... | 174/149 B |
| 6,687,814 B1 * | 2/2004 | Duppong | ....................... | 713/1 |
| 6,749,451 B2 * | 6/2004 | Schmitt | ...................... | 439/218 |
| 6,752,665 B2 * | 6/2004 | Kha et al. | .................... | 439/668 |
| 7,285,874 B2 * | 10/2007 | Menas et al. | .................. | 307/80 |

\* cited by examiner

*Primary Examiner*—Chandrika Prasad
(74) *Attorney, Agent, or Firm*—MacPherson Kwok Chen & Heid LLP; Brent A. Folsom

(57) ABSTRACT

A power control system and related methods are disclosed herein to allow convenient distribution of a variety of different power sources to various electrical systems under test. For example, in accordance with an embodiment of the present invention, a modular power control system includes a multipin power input connector adapted to receive a plurality of supplied power types associated with corresponding pins of the power input connector. A plurality of multipin power output connectors are provided. The supplied power types are associated with corresponding pins of the power output connectors. A plurality of power distribution modules associated with the power output connectors are provided. Each module is adapted to selectively route a selected one of the supplied power types received by a pin of the input connector to a corresponding pin of its associated power output connector.

16 Claims, 12 Drawing Sheets

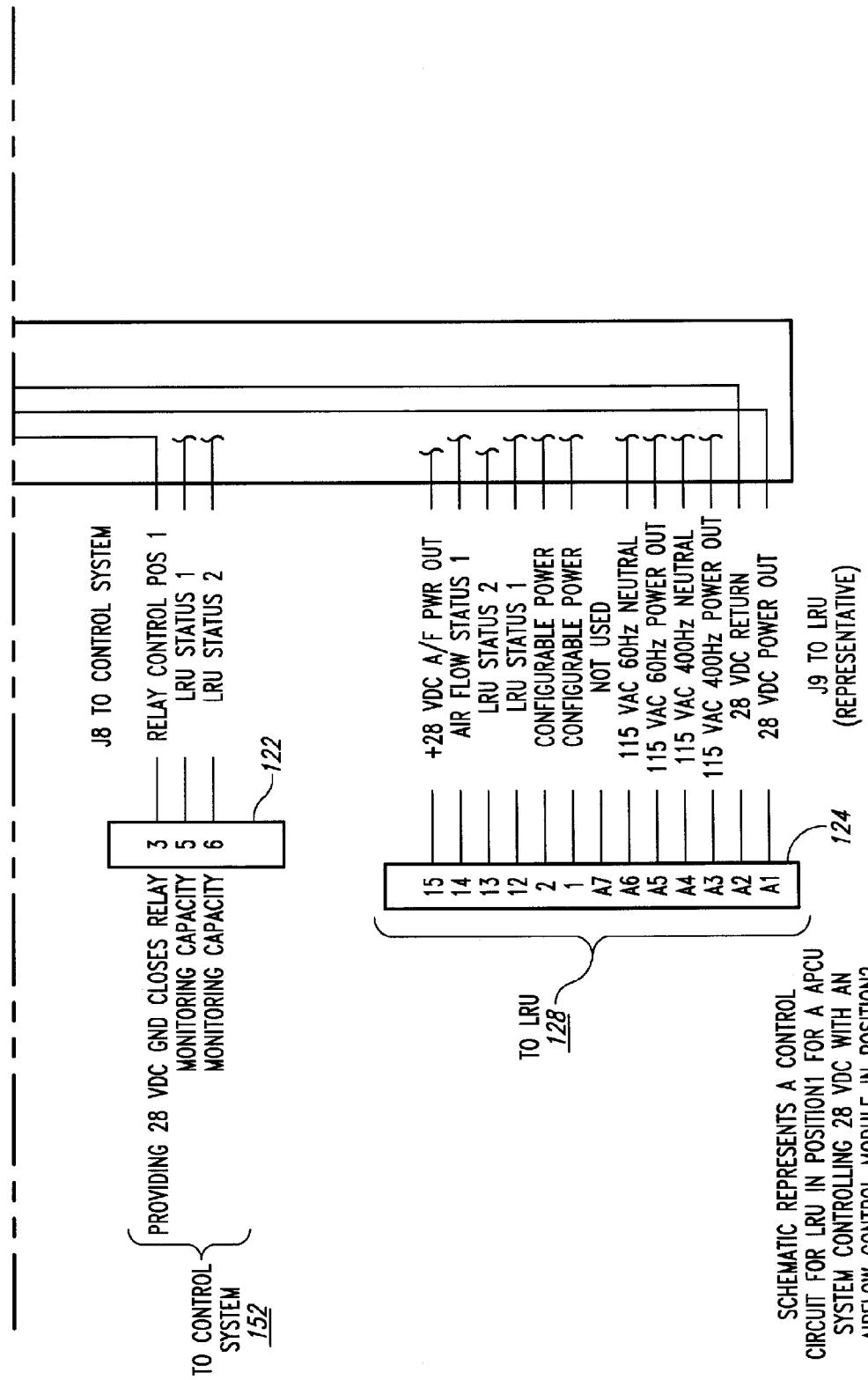

MODULAR POWER CONTROL SYSTEM WITH MULTIPIN CONNECTORS AND AIRFLOW CONROL MODULE

TECHNICAL FIELD

The present invention relates generally to power distribution and, more specifically, to power distribution systems supporting a plurality of power types.

BACKGROUND

Modern aircraft typically employ sophisticated electrical systems having differing power requirements. During the development and ongoing maintenance of such aircraft, it is often necessary to test these electrical systems to ensure predictable and reliable operation. For example, during the development of a new aircraft design, the various electrical systems of the aircraft are typically connected with appropriate power supplies for evaluation and quality assurance.

Because of the varying power requirements for such electrical systems, existing approaches to testing and maintenance typically rely on hand-wired power distribution systems that are custom built for individual electrical systems under test. Unfortunately, such approaches are labor-intensive, costly, and can require long lead times to implement. In addition, if power requirements change for a given electrical system, it can be especially inconvenient and expensive to modify a hand-wired system to accommodate an alternate power supply.

In addition, because of the non-standard nature of hand-wired power distribution systems, there is an ongoing risk of damaging a given electrical system under test by inadvertently connecting an incorrect power supply to the electrical system. Such risks are especially hazardous where costly prototype systems are being tested.

In another approach, DIN rail power supplies may be used to power aircraft electrical systems under test. Unfortunately, such implementations typically rely on dedicated, non-configurable modules to provide each desired power type used in a given application. As a result, if a different power type is desired, a new dedicated module must be provided for the desired power type which can consequently increase costs.

Accordingly, there is a need for an improved approach to power distribution that provides reliable distribution of a variety of different power sources to various electrical systems under test. In particular, there is a need for an improved power distribution system and method that can accommodate the particular requirements of aircraft electrical systems.

SUMMARY

In accordance with one embodiment of the present invention, a modular power control system includes a multipin power input connector adapted to receive a plurality of supplied power types associated with corresponding pins of the power input connector; a plurality of multipin power output connectors, wherein the supplied power types are associated with corresponding pins of the power output connectors; and a plurality of power distribution modules associated with the power output connectors, wherein each module is adapted to selectively route a selected one of the supplied power types received by a pin of the input connector to a corresponding pin of its associated power output connector.

In accordance with another embodiment of the present invention, a method of distributing power to a plurality of devices under test includes receiving a plurality of supplied power types at associated pins of a multipin power input connector; selecting a first one of the supplied power types received by a first pin of the power input connector; selecting a second one of the supplied power types received by a second pin of the power input connector; routing the selected first one of the supplied power types to an associated pin of a first power output connector; and routing the selected second one of the supplied power types to an associated pin of a second power output connector.

In accordance with another embodiment of the present invention, an aircraft testing apparatus includes a multipin power input connector adapted to receive a plurality of supplied power types associated with corresponding pins of the power input connector; a plurality of multipin power output connectors, wherein the supplied power types are associated with corresponding pins of the power output connectors; a plurality of printed wiring boards associated with the power output connectors, wherein each printed wiring board is adapted to selectively route a selected one of the supplied power types received by a pin of the input connector to a corresponding pin of the printed wiring board's associated power output connector, wherein the printed wiring boards are enabled by a control signal; an airflow control module adapted to provide the control signal in response to an airflow sensor; a chassis; and a connector board mounted in the chassis, wherein the power input connector and the power output connectors are mounted on the connector board.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
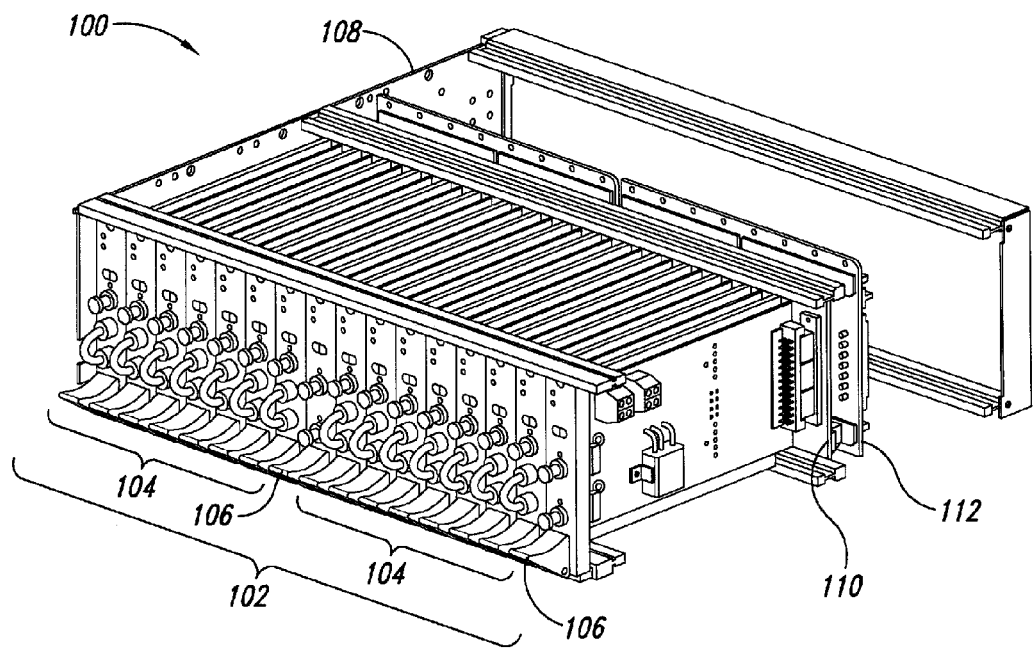
FIG. 1 illustrates a perspective view of a power control system in accordance with an embodiment of the present invention.

FIG. 1 illustrates a perspective view of a power control system 100 in accordance with an embodiment of the present invention. As will be further described in various example embodiments set forth herein, power control system 100 is modular in design and may be configured to selectively distribute a plurality of supplied power types (e.g., particular voltages and/or currents) to a plurality of electrical systems under test. Advantageously, particular supplied power types may be routed to particular pins of multipin output connectors to prevent incorrect power types from being inadvertently supplied to the electrical systems. In addition, power distribution to individual electrical systems may be further controlled in response to the detection of cooling air provided to power control system 100 and/or electrical systems under test.

Although power control system 100 is particularly well suited for the testing of aircraft electrical systems, other applications are also contemplated. In addition, although power control system 100 will be chiefly described herein with respect to power types specified by particular voltages (i.e., supply voltages), it will be appreciated that power control system 100 may also be used in connection with power types specified by particular current values (i.e., supply currents).

As illustrated in FIG. 1, power control system 100 includes a plurality of modules 102, a chassis 108, a plurality of backplane boards 110, and a plurality of connector boards 112. Chassis 108 may be implemented, for example, as a rack-mountable chassis to house and support modules 102, backplane boards 110, and connector boards 112 in a compact space.

Modules 102 may include a plurality of power distribution modules 104 and a plurality of airflow control modules 106. As further described herein, each of power distribution modules 104 may be associated with a corresponding power output connector of power control system 100 and may be configured to selectively route a supplied power type received from an external power source to the associated power output connector.

Similarly, each of airflow control modules 106 may be associated with a corresponding power output connector of power control system 100 and may be configured to selectively route a supplied power type received from an external power source to an associated fan configured to cool power control system 100 and/or an electrical system under test. In addition, each of airflow control modules 106 may be associated with a corresponding airflow sensor and configured to provide one or more control signals to selectively enable power distribution modules 104 in response to a detected status of the associated airflow sensor.

Each of modules 102 may be independently installed or removed from power control system 100 to accommodate desired configurations of modules 102. When installed, modules 102 may be engaged with connectors of backplane board 110 as will be further described herein. In one embodiment, each of modules 102 is implemented as a printed wiring board (i.e., a printed circuit board). As a result, the implementation of individual modules 102 may be standardized without the need for hand-wiring.

As previously described, power control system 100 may be implemented to support various power types. In one embodiment, power control system 100 may be implemented to provide a maximum current of approximately 220 amps apportioned between 16 of modules 102. For example, in such an embodiment, a group of 8 power distribution modules 104 could be implemented to collectively provide approximately 40 amps at 28 VDC, approximately 40 amps at 115 VAC 400 Hz, and approximately 30 amps at 115 VAC 60 Hz. By combining up to 13 instances of power control system 100, up to approximately 2860 amps may be provided across 208 discrete outputs, with one output being associated with each power distribution module 104.

Also in such an embodiment, each power distribution module 104 may be implemented to individually distribute up to approximately 15 amps at 28 VDC, approximately 10 amps at 115 VAC 60 Hz, approximately 15 amps at 115 VAC 400 Hz, or approximately 3 amps at user-configurable voltages. In addition, each airflow control module 106 may be implemented to individually distribute up to approximately 5 amps at 28 VDC, approximately 5 amps at 115 VAC 60 Hz, approximately 5 amps at 115 VAC 400 Hz, or approximately 3 amps at user-configurable voltages to an associated fan.

Figure 2:
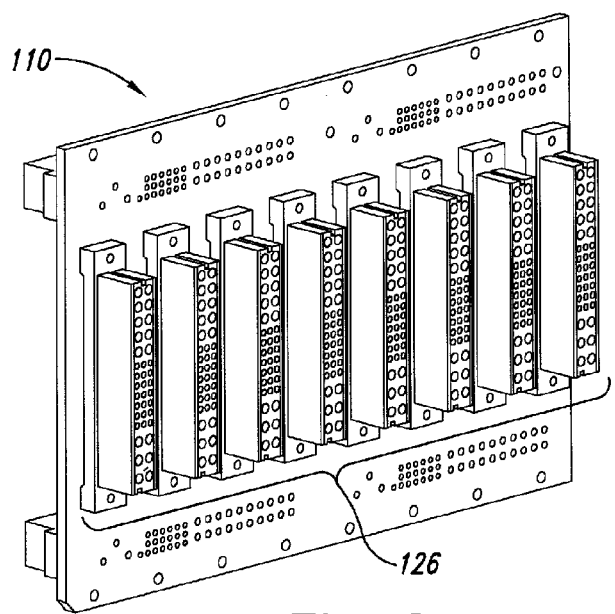
FIG. 2 illustrates a perspective view of a backplane board of a power control system in accordance with an embodiment of the present invention.

FIG. 2 illustrates a perspective view of backplane board 110 in accordance with an embodiment of the present invention. As shown, backplane board 110 includes a plurality of backplane connectors 126, each of which may interface with one of modules 102 when installed in power control system 100. In the embodiment of FIG. 2, eight backplane connectors 126 are provided. For example, power control system 100 may be implemented with two backplane boards 110 to accommodate up to sixteen modules 102 as illustrated in FIG. 1. However, it will be appreciated that any desired number of backplane connectors 126 or modules 102 may be used.

Figure 3:
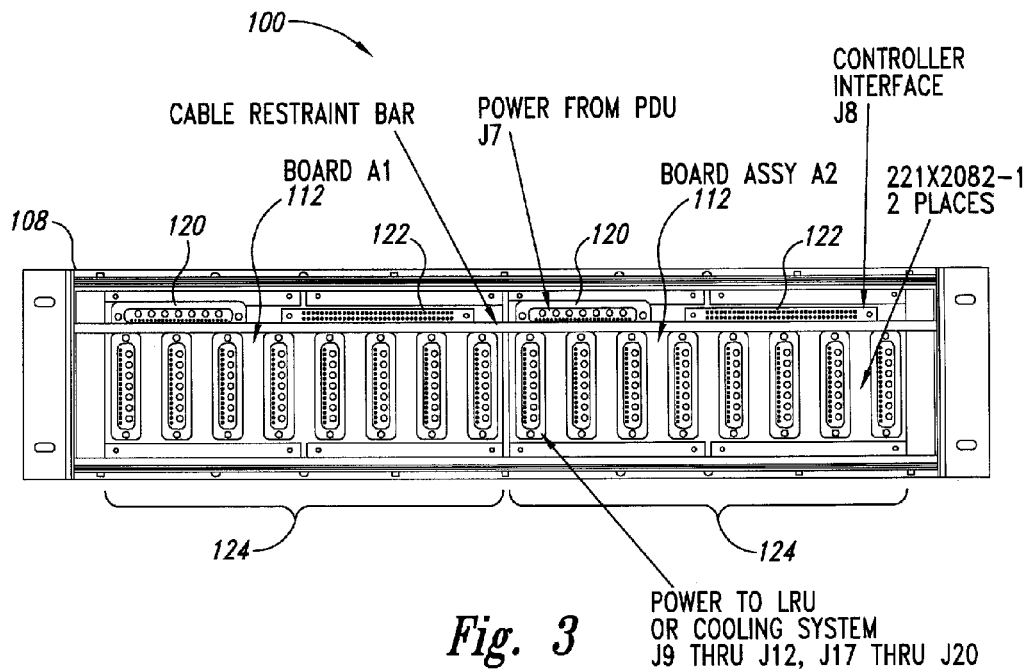
FIG. 3 illustrates a rear view of a power control system in accordance with an embodiment of the present invention.

FIG. 3 illustrates a rear view of power control system 100 in accordance with an embodiment of the present invention. As shown, power control system 100 includes two connector boards 112, each of which may include a power input connector 120, a control interface connector 122, and a plurality of power output connectors 124. As also shown, power input connectors 120, control interface connectors 122, and power output connectors 124 may each be implemented as multipin connectors. As further shown in FIG. 3, power input connectors 120 and power output connectors 124 may each be implemented as D-shell connectors.

Figure 4:
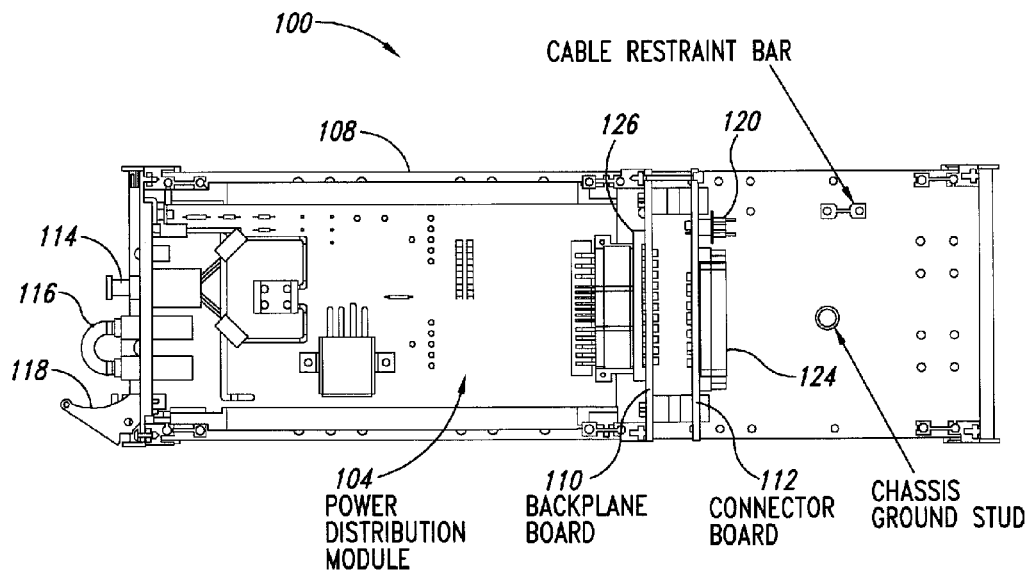
FIG. 4 illustrates a side view of a power control system in accordance with an embodiment of the present invention.

FIG. 4 illustrates a side view of power control system 100 in accordance with an embodiment of the present invention. In the embodiment of FIG. 4, a single power distribution module 104 is illustrated. Power distribution module 104 includes a circuit breaker 114 and a power jumper 116 which will be further described herein. Power distribution module 104 further includes a release latch 118 which may be used to release (i.e., disengage) and remove power distribution module 104 from power control system 100. As shown, power distribution module 104 is engaged with backplane connector 126 of backplane board 110. Backplane connector 126 is associated with power output connector 124 which may be connected with an electrical system under test through an appropriate cable.

Figure 5A:
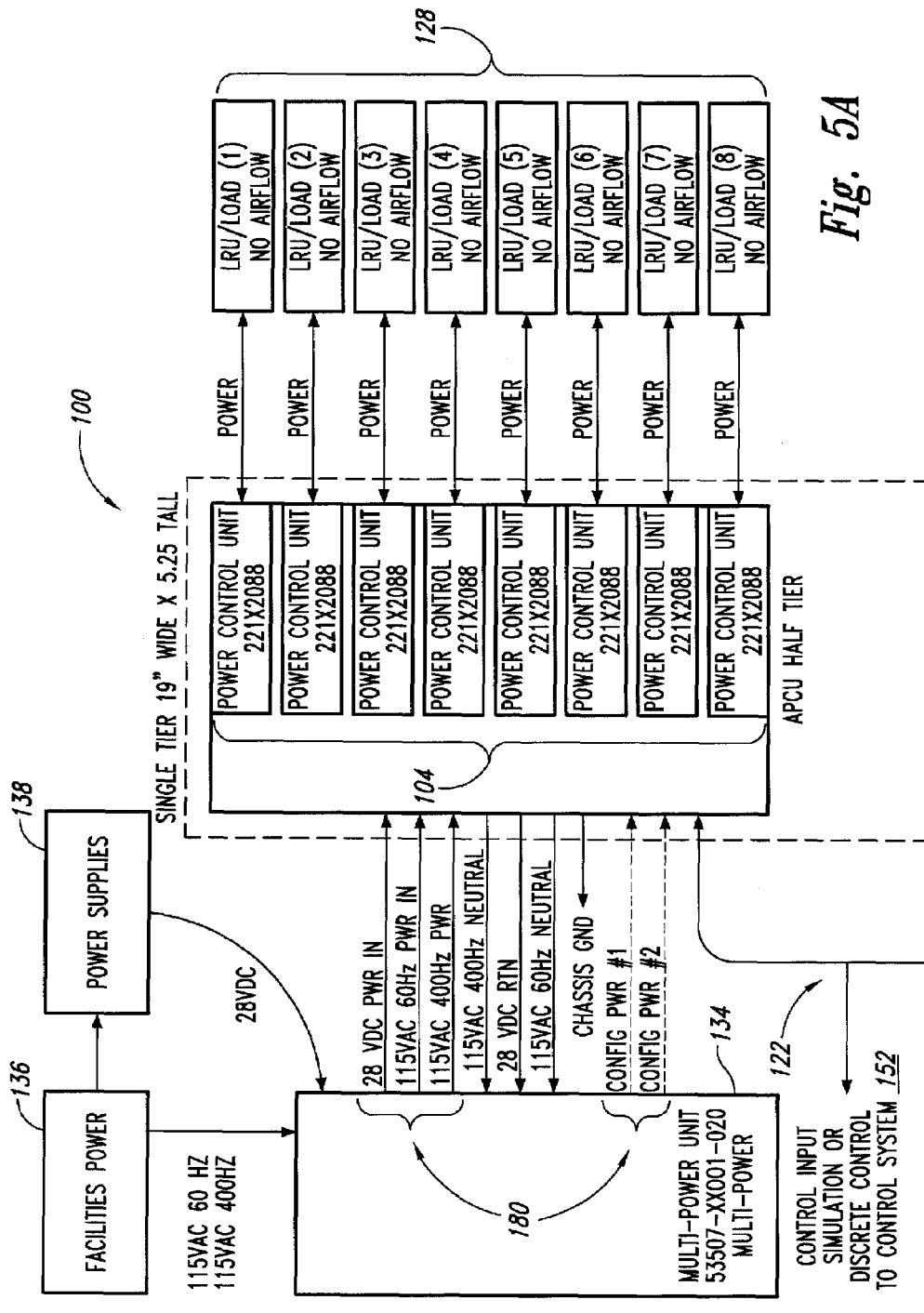
FIG. 5 illustrates a block diagram of a power control system in accordance with an embodiment of the present invention.
Figure 5B:
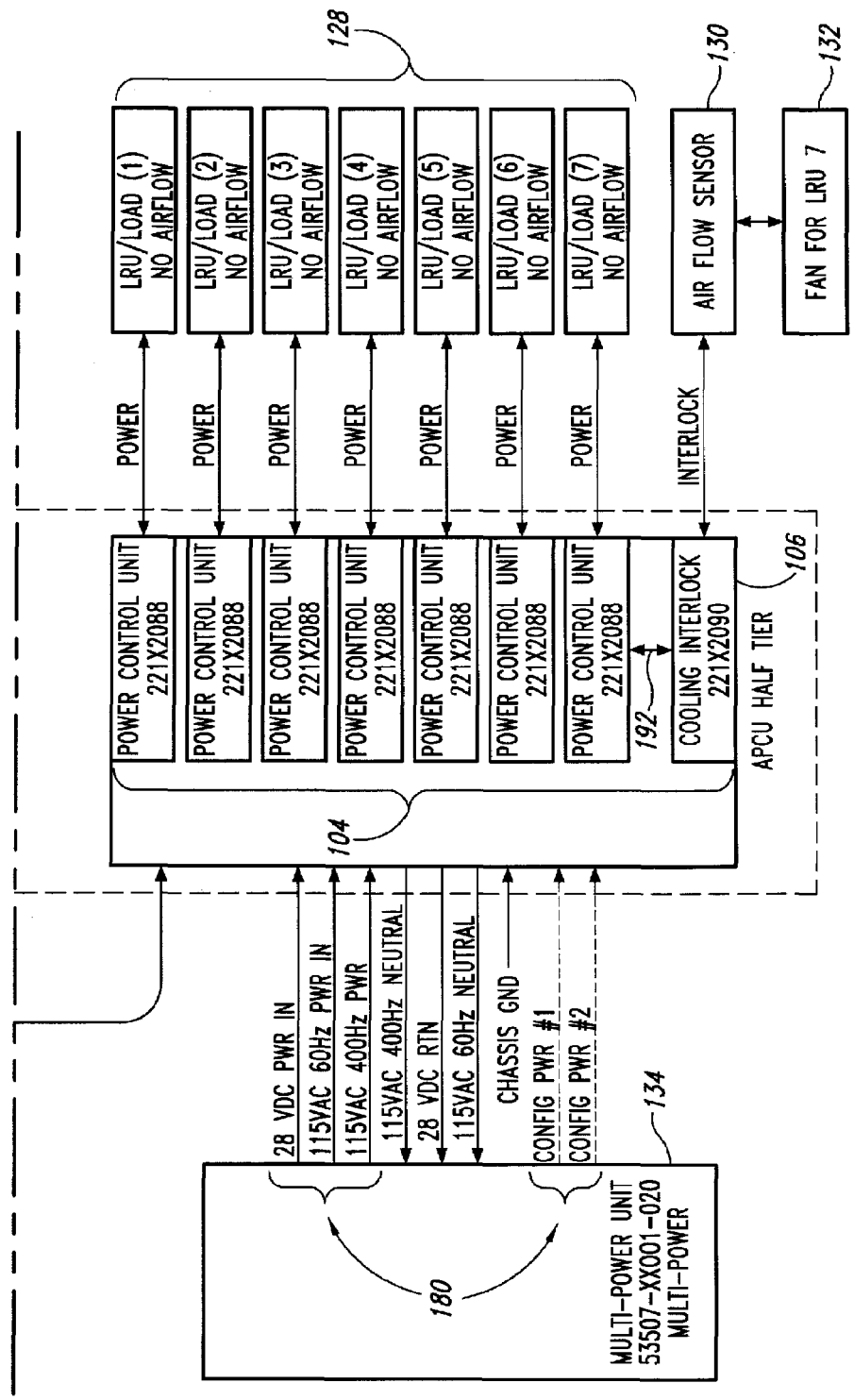

FIG. 5 illustrates a block diagram of power control system 100 in accordance with an embodiment of the present invention. Power control system 100 may be implemented in two half tiers, each of which may be associated with a corresponding backplane board 110, connector board 112, and group of eight modules 102. In the embodiment of FIG. 5, power control system 100 includes 15 power distribution modules 104 and a single airflow control module 106.

Each one of power distribution modules 104 is connected with an electrical system 128 under test. In one embodiment, electrical systems 128 may be line replaceable units ("LRUs") which represent individual aircraft electrical systems. It will be appreciated that each of power distribution modules 104 may be connected to one of electrical systems 128 through an associated power output connector 124 and an appropriate multi-wire cable.

As also shown in FIG. 5, each half tier of power control system 100 may receive a plurality of supply voltages 180 from a multi-power unit 134 through associated power input connectors 120. Power is provided to multi-power units 134 from facilities power 136 (e.g., power provided by a testing facility) and/or power supplies 138 interfaced with facilities power 136. In this regard, it will be appreciated that multi-power units 134 may include appropriate transformers and other circuitry to provide various illustrated supply voltages 180 to power control system 100 and to implement appropriate breaker and control functions. It will be appreciated that any desired power supplies may be used in place of multi-power units 134 including, for example, power cords running to associated outlets, 28 VDC power supplies, 115 VAC 60 Hz power supplies, 115 VAC 400 Hz power supplies, user-configured power supplies, or others.

In one embodiment, supply voltages 180 may include, but need not be limited to: 28 VDC, 115 VAC 60 Hz, 115 VAC 400 Hz, as well as other supply voltages (labeled "Config Pwr"). Accordingly, it will be appreciated that power control system 100 may accommodate various voltages appropriate for testing aircraft electrical systems.

Airflow control module 106 is interfaced with an airflow sensor 130 which may be implemented to provide a predetermined voltage (for example, 28 VDC) to airflow control module 106 (i.e., over the illustrated "Interlock" connection) in response to airflow sensor's 130 detection of airflow provided by a fan 132. In this regard, it will be appreciated that even if fan 132 is powered, airflow control module 106 will not receive the predetermined voltage from airflow sensor 130 unless air movement is actually detected by airflow sensor 130. As illustrated, airflow control module 106 is further interfaced with the lowermost illustrated power distribution module 104 over a control channel 192 to provide a control signal to selectively enable the lowermost illustrated power distribution module 104 to distribute power to one of electrical systems 128 as will be further described herein.

Power control system 100 may be further interfaced with a control system 152 through control interface connector 122. Control system 152 may be used, for example, to selectively ground one or more pins of control interface connector 122 to selectively enable individual modules 102, as further described herein.

Figure 6A:
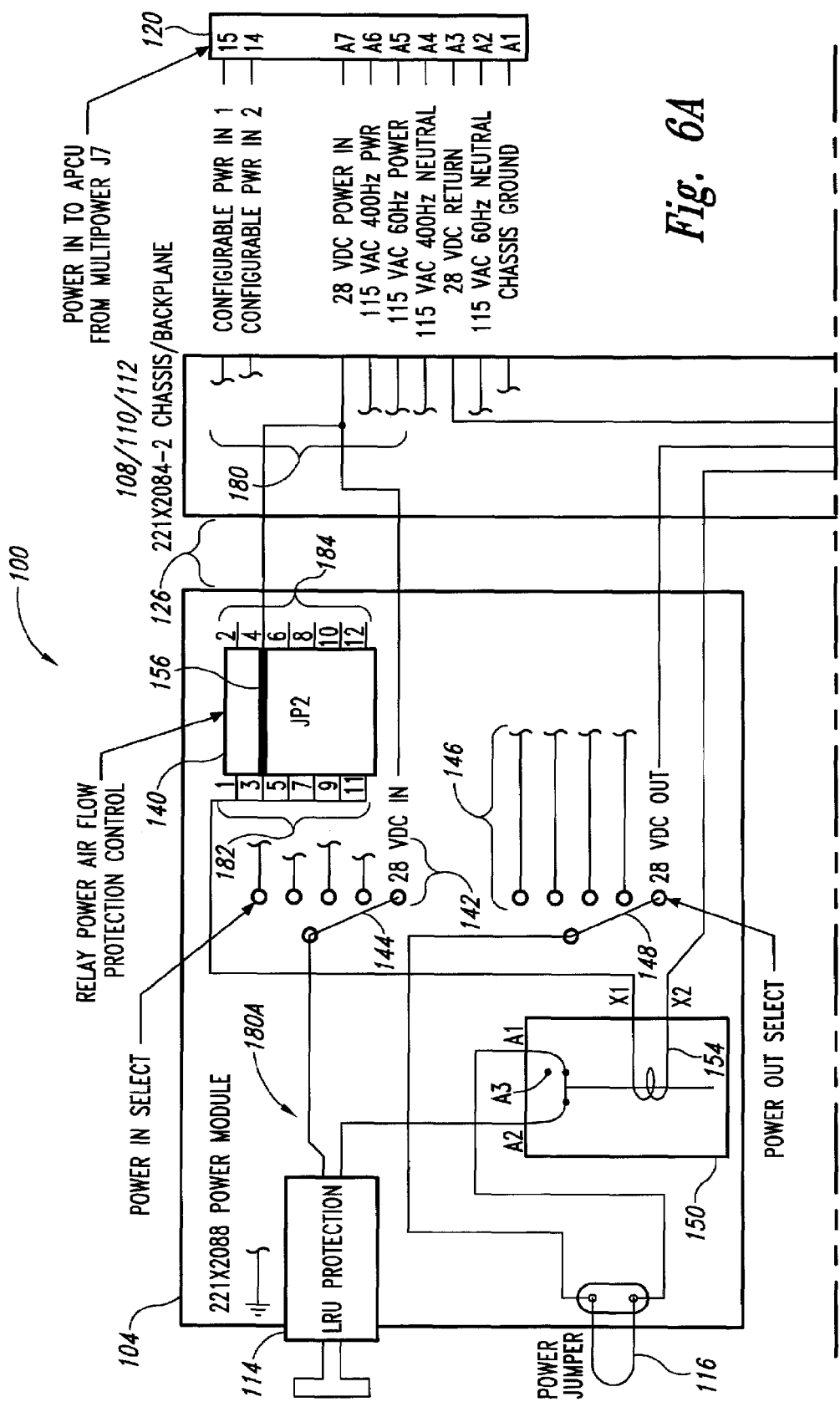
FIG. 6 illustrates a schematic diagram of a power control system including one power distribution module in accordance with an embodiment of the present invention.
Figure 6B:
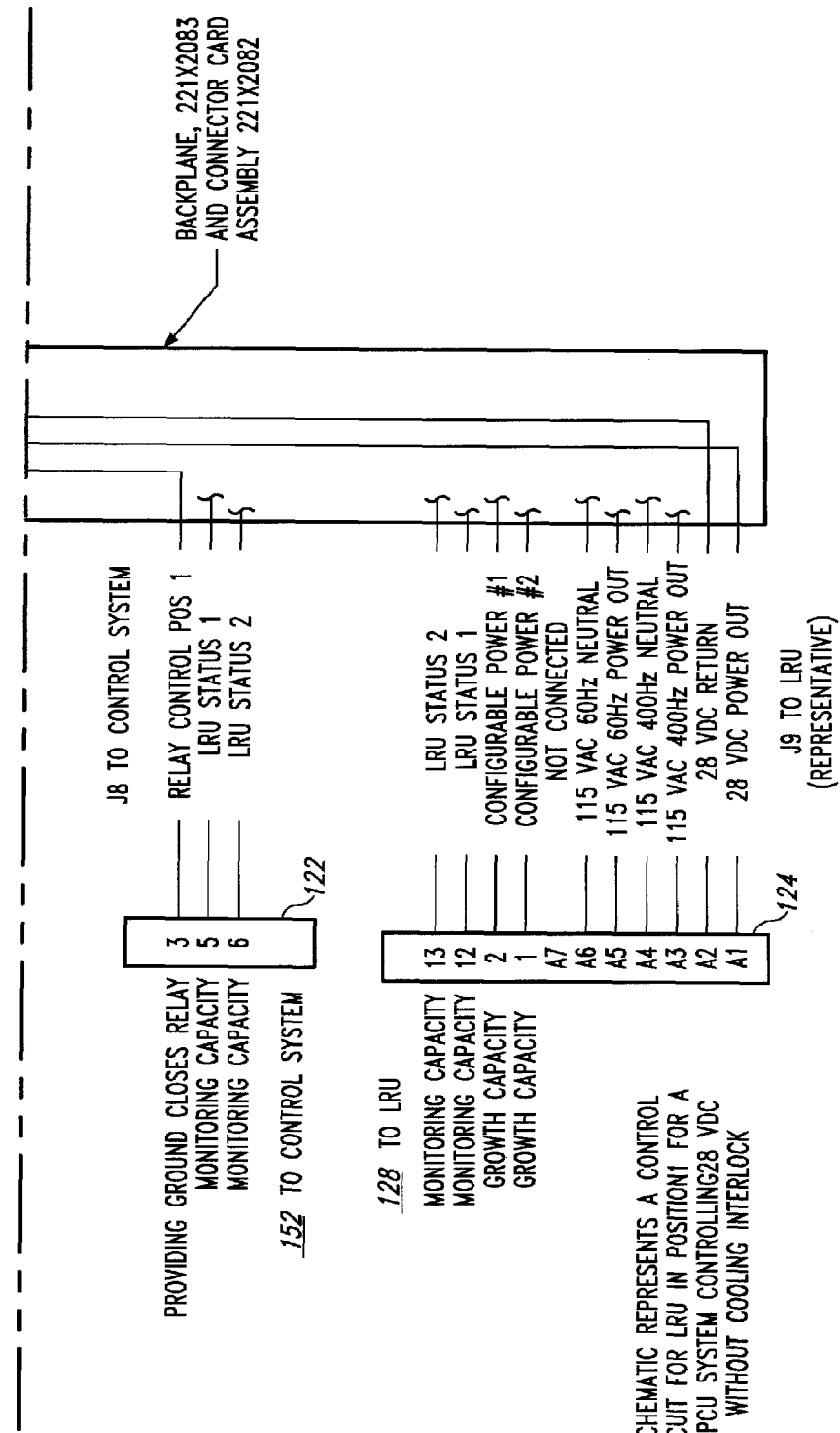

FIG. 6 illustrates a schematic diagram of power control system 100 with one power distribution module 104 in accordance with an embodiment of the present invention. As shown, supply voltages 180 are received by power input connector 120 from, for example, multi-power unit 134 as previously described. Supply voltages 180 may be passed from pins A5, A6, A7, 14, and 15 of power input connector 120 through connector board 112, backplane board 110, and backplane connector 126 to a plurality of supply voltage input terminals 142 of power distribution module 104. In this regard, each one of supply voltage input terminals 142 may receive a corresponding one of supply voltages 180.

As shown, power distribution module 104 also includes a plurality of supply voltage output terminals 146. Power distribution module 104 may be configured to route one of supply voltages 180 from a selected one of supply voltage input terminals 142 to a selected one of supply voltage output terminals 146. Supply voltage output terminals 146 are connected with pins A1, A3, A5, 1, and 2 of power output connector 124 through backplane connector 126, backplane board 110, and connector board 112. Power output connector 124 is in turn connected with one of electrical systems 128 (e.g., an LRU) through an appropriate multi-wire cable.

Turning now to the particulars of power distribution module 104, it will be appreciated from FIG. 6 that power distribution module 104 includes a hardwired input connection 144 which may be connected with one of supply voltage input terminals 142. For example, in the embodiment of FIG. 6, hardwired input connection 144 is connected with a 28 VDC supply voltage. However, it will be appreciated that hardwired input connection 144 could alternatively be connected with any other one of supply voltage input terminals 142.

Power distribution module 104 further includes circuit breaker 114, power jumper 116, and a relay 150. A particular supply voltage 180A received by hardwired input connector 144 (e.g., 28 VDC in this embodiment) passes through circuit breaker 114 before reaching a terminal A2 of relay 150. Accordingly, it will be appreciated that supply voltage 180A may be interrupted between hardwired input connection 144 and terminal A2 if circuit breaker 114 is activated. In one embodiment, circuit breaker 114 (as well as circuit breakers 172 and 176 further discussed herein) may be implemented as BACC18Z thermal circuit breakers.

Relay 150 includes a coil 154 which, when energized, will cause terminals A1 and A2 of relay 150 to be connected as illustrated in FIG. 6, thereby passing supply voltage 180A received at hardwired input connection 144 through terminals A1 and A2 of relay 150. Alternatively, when coil 154 is not energized, terminals A2 and A3 will be connected instead, thereby interrupting the path between terminals A1 and A2 of relay 150. In one embodiment, relay 150 (as well as relay 170 further discussed herein) may be implemented as a single pole double throw MIL-R-6106/19 relay available from CII, a Tyco subsidiary.

Power distribution module 104 further includes a hardwired output connection 148 which may be connected with one of supply voltage output terminals 146. As illustrated, terminal A1 of relay 150 is connected with hardwired output connection 148 through power jumper 116. Accordingly, it will be appreciated that supply voltage 180A may be interrupted between hardwired input connection 144 and hardwired output connection 148 if power jumper 116 is removed, for example, by a user of power control system 100.

When terminals A1 and A2 of relay 150 are connected (i.e., when coil 154 is energized), supply voltage 180A received through hardwired input connection 144 may be passed through circuit breaker 114, relay 150, power jumper 116, and hardwired output connection 148 to one of supply voltage output terminals 146. As previously described, supply voltage output terminals 146 are connected with power output connector 124 through backplane connector 126, backplane board 110, and connector board 112. Power output connector 124 is in turn connected with electrical system 128. Accordingly, supply voltage 180A may be routed through power distribution module 104 to electrical system 128.

Power distribution module 104 further includes a jumper block 140 with a plurality of odd-numbered contacts 182 and a plurality of even-numbered contacts 184 as shown. A jumper 156 may be connected between one of odd-numbered contacts 182 and one of even-numbered contacts 184 in order to provide a desired one of supply voltages 180 to a terminal X1 of coil 154. As shown in the embodiment of FIG. 6, contact 4 of jumper block 140 may receive a 28 VDC voltage and be connected with contact 3 of jumper block 140 to provide the 28 VDC voltage to coil 154.

Power control system 100 may be further connected with a control system 152 through a plurality of pins of control interface connector 122. For example, each of modules 102 installed in power control system 100 may be connected with control system 152 through an associated pin of control interface connector 122. As a result, each of modules 102 may be independently controlled by control system 152.

In the embodiment of FIG. 6, terminal X2 of coil 154 is connected with control system 152 through backplane connector 126, backplane board 110, and pin 3 of control interface connector 122. As a result, when an appropriate voltage (e.g., 28 VDC) is received at terminal X1, coil 154 may be energized by control system 152 by grounding pin 3 of control interface connector 122 (which in turn grounds a terminal X2 of coil 154). As a result, relay 150 may be turned on and off in response to control system 152, thereby allowing the routing of supply voltages 180 through power distribution module 104 to be selectively enabled or disabled by control system 152.

It will be appreciated that additional power distribution modules 104 may be installed in the embodiment illustrated in FIG. 6. Such additional power distribution modules 104 may be configured to support the selective routing of supply voltages 180 to additional electrical systems 128 (e.g., LRUs) and may be independently controlled by control system 152 through appropriate pins of control interface connector 122.

Figure 7A:
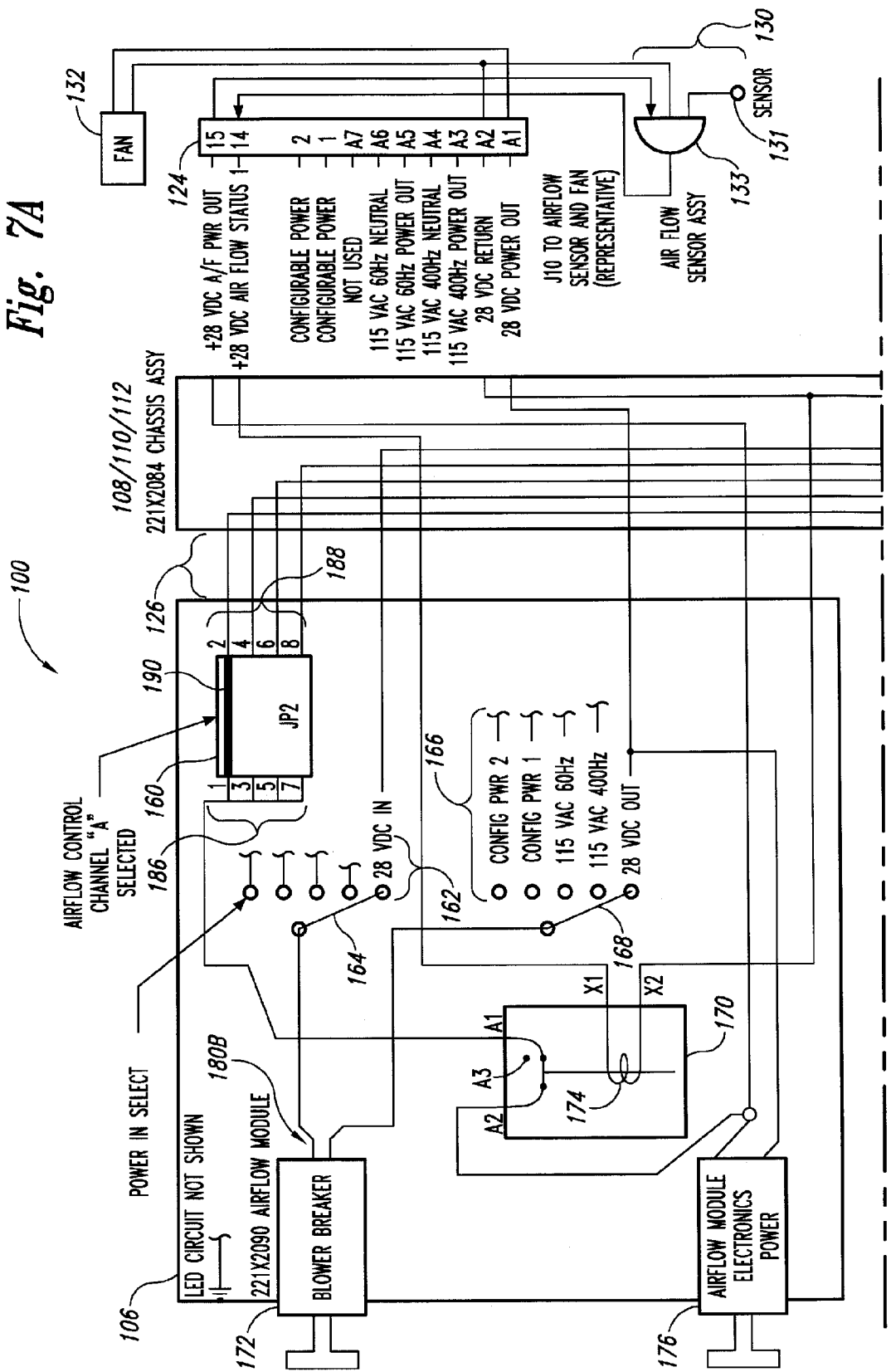
FIG. 7 illustrates a schematic diagram of a power control system including one power distribution module and one airflow control module in accordance with an embodiment of the present invention.
Figure 7B:
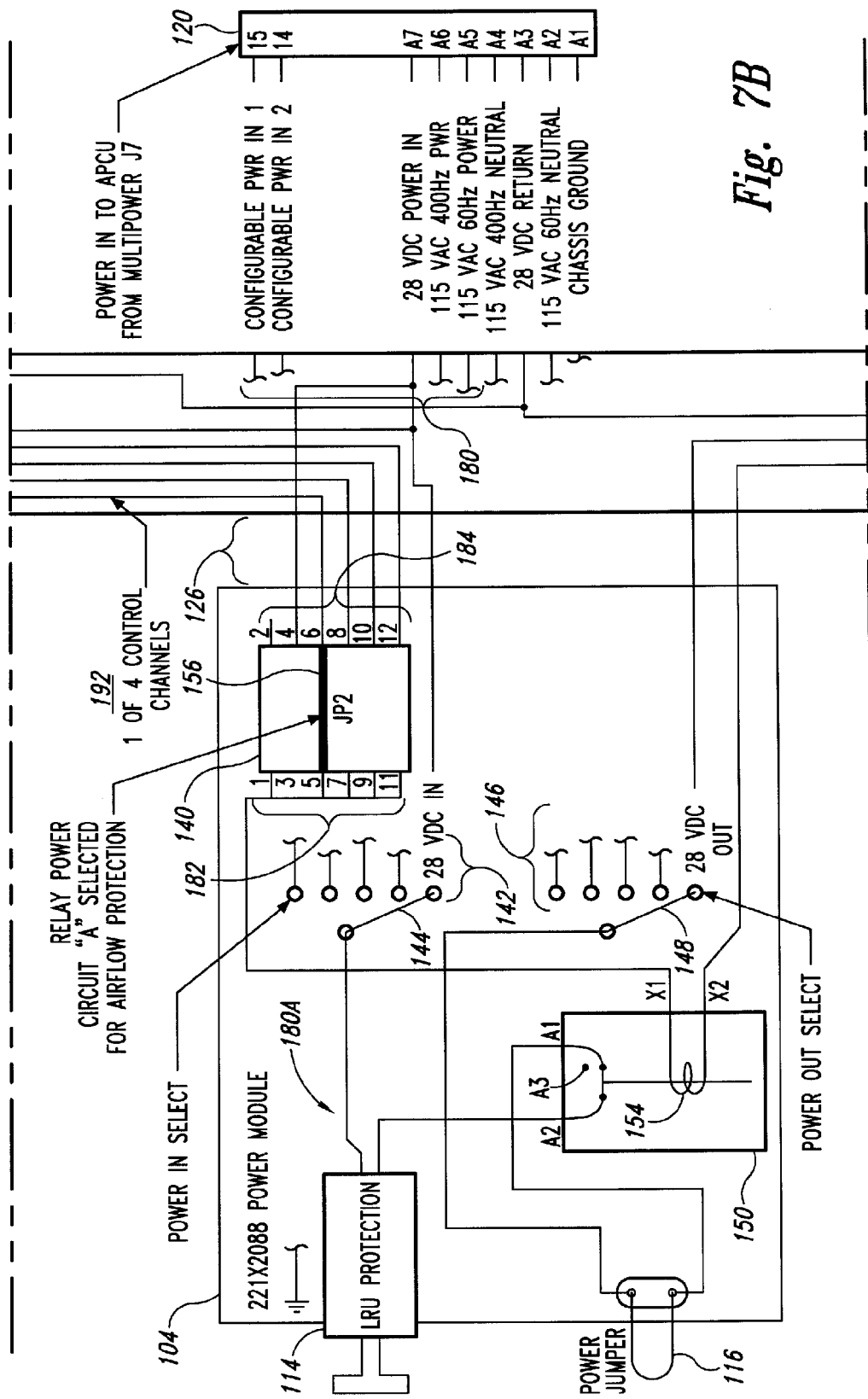

FIG. 7 illustrates a schematic diagram of power control system 100 including one power distribution module 104 and one airflow control module 106 in accordance with an embodiment of the present invention. It will be appreciated that power distribution module 104 of FIG. 7 may be implemented as previously described with respect to FIG. 6. Power control system 100 of FIG. 7 may also be connected with control system 152 and electrical system 128 in the manner previously described in relation to FIG. 6. However, power control system 100 of FIG. 7 is further connected with airflow sensor 130 (which includes a sensor portion 131 and a logic portion 133) and fan 132.

Airflow control module 106 may be configured to route one of supply voltages 180 from a selected one of supply voltage input terminals 162 to a selected one of supply voltage output terminals 166 in order to provide appropriate power to fan 132. Similar to power distribution module 104, airflow control module 106 includes a jumper block 160, a plurality of supply voltage input terminals 162, a plurality of supply voltage output terminals 166, hardwired input and output connections 164 and 168, a circuit breaker 172, and a relay 170. Airflow control module 106 further includes airflow module electronics circuit breaker 176.

Supply voltage input terminals 162 of airflow control module 106 may receive supply voltages 180 passed from power input connector 120 through connector board 112, backplane board 110, and backplane connector 126. In this regard, each one of supply voltage input terminals 162 may receive a corresponding one of supply voltages 180.

As illustrated in FIG. 7, hardwired input connection 164 is connected with one of supply voltage input terminals 162. For example, in the embodiment of FIG. 7, hardwired input connection 164 is connected with a 28 VDC supply voltage. However, it will be appreciated that hardwired input connection 164 could alternatively be connected with any other one of supply voltage input terminals 162. A connected supply voltage 180B (e.g., 28 VDC in this embodiment) passes through circuit breaker 172 before reaching one of supply voltage output terminals 166 through hardwired output connection 168. Accordingly, the path between hardwired input and output connections 164 and 168 may be interrupted if circuit breaker 172 is activated.

Supply voltage output terminals 166 are connected with a power output connector 124 (which, for example, may be implemented as one of power output connectors 124) through backplane connector 126, backplane board 110, and connector board 112. Power output connector 124 is in turn connected with fan 132. As a result, supply voltage 180B may be routed through airflow control module 106 to fan 132 in order to provide fan 132 with appropriate power for operation.

Power output connector 124 is further connected with airflow sensor 130 (i.e., through pins A2, 14, and 15). If airflow sensor 130 detects air movement resulting from, for example, the operation of fan 132, 28 VDC may be provided to pin 14 of power output connector 124 which may be passed to a terminal X1 of relay 170 as illustrated. A terminal X2 of relay 170 is in turn connected with pin A3 of power input connector 120. Accordingly, if airflow sensor 130 detects air movement, then a coil 174 of relay 170 may be energized, thereby causing terminals A1 and A2 of relay 170 to be connected as shown in FIG. 7. Alternatively, if airflow sensor 130 detects no air movement, then airflow sensor 130 will not pass the illustrated voltage to terminal X1 of coil 174. In this case, the connection between terminals A1 and A2 of relay 174 will be interrupted.

Jumper block 160 of airflow control module 106 includes a plurality of odd-numbered contacts 186 and a plurality of even-numbered contacts 188 as shown. As illustrated, even-numbered contacts 188 of airflow control module 106 are connected with even-numbered contacts 184 of power distribution module 104 through backplane connectors 126 and backplane board 110 to provide up to four control channels 192 for independently controlling the operation of one or more power distribution modules 104 (e.g., four power distribution modules 104, each associated with one of control channels 192) in response to airflow sensor 130. For example, in FIG. 7, pin 6 of jumper block 140 is connected with pin 2 of jumper block 160.

As illustrated, 28 VDC is provided to terminal A2 of relay 170 from the output terminal of circuit breaker 176. Accordingly, when coil 174 is energized (i.e., in response to a predetermined voltage provided by airflow sensor 130), 28 VDC will be passed from the output terminal of circuit breaker 176 through terminals A2 and A1 of relay 170 to odd-numbered terminals 186 of jumper block 160. Odd-numbered terminals 186 may selectively be connected with even numbered terminals 188 through a jumper 190. As a result, when airflow is detected by airflow sensor 130, a control signal may be provided through jumper block 160 of airflow control module 106 to jumper block 140 of power distribution module 104.

In the embodiment of FIG. 7, jumper 156 of power distribution module 104 is connected between pins 5 and 6 of jumper block 140. Accordingly, the voltage provided through jumper block 160 may in turn be provided to coil 154 of relay 150, thereby causing terminals A1 and A2 of relay 150 to connect if terminal X2 of coil 154 is grounded by control system 152. Therefore, it will be appreciated that the distribution of supply voltages 180 by power distribution module 104 operation can be selectively enabled or disabled by control channels 192 in response to whether fan 132 is providing cooling air (i.e., airflow).

It will be also appreciated that additional power distribution modules 104 may be connected with control channels 192 through their respective jumper blocks 140, thereby permitting additional power distribution modules 104 to be controlled in response to airflow control module 106. For example, one or more modules 104 may be connected with a shared control channel 192, and/or may be connected to different control channels 192. In this regard, it will further be appreciated that additional power distribution modules 104 and/or additional airflow control modules 106 may be installed in the embodiment illustrated in FIG. 7 to support the selective routing of supply voltages 180 to additional electrical systems 128 and fans 132, and the provisioning of additional control channels 192.

Upon inspection of FIGS. 6 and 7, it will be appreciated that the various voltages provided to power input connectors 120 and power output connectors 124 may be implemented consistently across all such connectors of power control system 100. For example, as shown in FIGS. 6 and 7, the various supply voltages 180 received at particular pins of power input connectors 120 (i.e., pins A5, A6, A7, 14, and 15) may be distributed by power control system 100 to particular pins of power output connectors 124 (i.e., pins A5, A3, A1, 1, and 2, respectively).

In addition, because of the one-to-one correspondence (i.e., association) between power distribution modules 104 and power output connectors 124, only a single power type (e.g., voltage or current) received through power input connector 120 will be distributed to each power output connector 124 by an associated power distribution module 104. Accordingly, it will be appreciated that power system 100 can prevent the distribution of an incorrect power type to one of electrical systems 128 under test.

For example, if one of electrical systems 128 is configured to receive 28 VDC through pin A1 of one of power output connectors 124, a higher supply voltage (for example, 115 VAC 400 Hz) will not be distributed to pin A1. Rather, if the associated power distribution module 104 is inadvertently configured to distribute 115 VAC 400 Hz (i.e., through configuration of hardwired input and output connections 144 and 148), then such voltage would be provided to pin A4, rather than pin A1 of power output connector 124. As a result, potentially sensitive low voltage components of electrical system 128 connected with pin A1 will not receive the higher voltage.

As also shown in FIGS. 6 and 7, hardwired input and output connections 144/148 and 164/168 may be physically oriented in parallel directions when each connection is configured for the same supply voltage 180. In this regard, the various power types received at supply voltage input terminals 142/162 may be implemented to correspond to the power types distributed from similarly positioned supply voltage output terminals 146/166. For example, in FIG. 6, 28 VDC is received through the lowermost one of supply voltage input terminals 142 and is distributed from the lowermost one of supply voltage output terminals 146. Because of the correspondence between the supply voltage input and output terminals 142 and 146, hardwired input and output connections 144/148 will exhibit a parallel physical orientation. It will be appreciated that such an implementation can aid shop personnel when configuring modules 102 for appropriate power distribution.

In one embodiment, supply voltage input and output terminals 142/162 and 146/166 may be implemented as plated through-holes which may receive hardwired input and output connections 144/164 and 148/168, respectively. For example, hardwired input and output connections 144/164 and 148/168 may be implemented as 12 AWG wire that is connected with the through-holes by soldering.

In view of the present disclosure, it will be appreciated that a modular power control system implemented in accordance with one or more of the various embodiments identified herein can provide a flexible approach to allowing distribution of a variety of different power sources to various electrical systems under test. In this regard, such a power control system may distribute significant power quantities to large numbers of electrical systems from a highly space-efficient rack-mountable chassis. For example, certain embodiments of the present invention may be approximately 35 times more space-efficient than prior approaches to power distribution for aircraft electrical systems.

Advantageously, individual power distribution modules may be configured to provide selected power types to connected electrical systems. In addition, individual power distribution modules may be selectively enabled by a control system as well as an airflow control module to interrupt the supply of power if cooling air is not provided by an associated fan.

Embodiments described above illustrate but do not limit the invention. It should also be understood that numerous modifications and variations are possible in accordance with the principles of the present invention. Accordingly, the scope of the invention is defined only by the following claims.

We claim:
1. A modular power control system comprising:
a multipin power input connector adapted to receive a plurality of supplied power types associated with corresponding pins of the power input connector;
a plurality of multipin power output connectors, wherein the supplied power types are associated with corresponding pins of the power output connectors;
a plurality of power distribution modules associated with the power output connectors, wherein each module is adapted to selectively route a selected one of the supplied power types received by a pin of the input connector to a corresponding pin of its associated power output connector, wherein each of the modules further comprises a relay adapted to selectively enable the module in response to a control signal; and
an airflow control module adapted to provide the control signal in response to an airflow sensor.
2. The modular power control system of claim 1, wherein each of the modules further comprises a hardwired input connection and a hardwired output connection adapted to route the selected supplied power type, wherein the hardwired input connection and the hardwired output connection exhibit a parallel physical orientation.
3. The modular power control system of claim 1, further comprising a backplane board, wherein the power distribution modules are adapted to be selectively engaged with the backplane board to permit insertion and removal of the power distribution modules from the modular power control system.
4. The modular power control system of claim 3, further comprising a connector board engaged with the backplane board, wherein the power input connector and the power output connectors are mounted on the connector board.
5. The modular power control system of claim 1, wherein the power distribution modules are implemented as printed wiring boards.
6. The modular power control system of claim 1, wherein the supplied power types are selected from the group consisting of: 28 VDC, 115 VAC 60 Hz, 115 VAC 400 Hz, and a user-defined voltage.
7. The modular power control system of claim 1, wherein the supplied power types correspond to specified electrical currents.
8. The modular power control system of claim 1, wherein each of the modules further comprises means for interrupting the routing of the selected supplied power type to the associated power output connector.
9. The modular power control system of claim 1, further comprising a line replaceable unit connected with at least one of the power output connectors and adapted to receive the selected supplied power type from the power distribution module associated with the at least one of the power output connectors.

10. A method of distributing power to a plurality of devices under test, the method comprising:
   receiving a plurality of supplied power types at associated pins of a multipin power input connector;
   selecting a first one of the supplied power types received by a first pin of the power input connector;
   selecting a second one of the supplied power types received by a second pin of the power input connector;
   routing the selected first one of the supplied power types to an associated pin of a first power output connector;
   routing the selected second one of the supplied power types to an associated pin of a second power output connector; and
   receiving a control signal, wherein the routing operations are enabled in response to the control signal, wherein the control signal is provided in response to a predetermined voltage received from an airflow sensor.

11. The method of claim 10, wherein the first and second routing operations are performed by first and second power distribution modules, respectively.

12. The method of claim 11, wherein the first and second selecting operations comprise hardwiring input and output connections of each of the first and second power distribution modules.

13. The method of claim 10, further comprising selectively interrupting the routing operations.

14. The method of claim 10, further comprising:
   receiving the selected first one of the supplied power types at a first line replaceable unit associated with the first power output connector; and
   receiving the selected second one of the supplied power types at a second line replaceable unit associated with the second power output connector.

15. An aircraft testing apparatus comprising:
   a multipin power input connector adapted to receive a plurality of supplied power types associated with corresponding pins of the power input connector;
   a plurality of multipin power output connectors, wherein the supplied power types are associated with corresponding pins of the power output connectors;
   a plurality of printed wiring boards associated with the power output connectors, wherein each printed wiring board is adapted to selectively route a selected one of the supplied power types received by a pin of the input connector to a corresponding pin of the printed wiring board's associated power output connector, wherein the printed wiring boards are enabled by a control signal;
   an airflow control module adapted to provide the control signal in response to an airflow sensor;
   a chassis; and
   a connector board mounted in the chassis, wherein the power input connector and the power output connectors are mounted on the connector board.

16. The aircraft testing apparatus of claim 15, further comprising a line replaceable unit connected with at least one of the power output connectors and adapted to receive the selected supplied power type from the printed wiring board associated with the at least one of the power output connectors.

* * * * *

UNITED STATES PATENT AND TRADEMARK OFFICE
CERTIFICATE OF CORRECTION

PATENT NO. : 7,393,248 B2 Page 1 of 1
APPLICATION NO. : 11/556647
DATED : July 1, 2008
INVENTOR(S) : David Mark Best et al.

It is certified that error appears in the above-identified patent and that said Letters Patent is hereby corrected as shown below:

On the Title Page - Item (54)

it should read: --MODULAR POWER CONTROL SYSTEM WITH MULTIPIN CONNECTORS AND AIRFLOW CONTROL MODULE-- instead of "MODULAR POWER CONTROL SYSTEM WITH MULTIPIN CONNECTORS AND AIRFLOW CONROL MODULE".

Signed and Sealed this

Second Day of September, 2008

JON W. DUDAS
*Director of the United States Patent and Trademark Office*

UNITED STATES PATENT AND TRADEMARK OFFICE
CERTIFICATE OF CORRECTION

PATENT NO. : 7,393,248 B2  Page 1 of 1
APPLICATION NO. : 11/556647
DATED : July 1, 2008
INVENTOR(S) : David Mark Best et al.

It is certified that error appears in the above-identified patent and that said Letters Patent is hereby corrected as shown below:

On the Title Page - Item (54) and Column 1, lines 1-3 it should read: --MODULAR POWER CONTROL SYSTEM WITH MULTIPIN CONNECTORS AND AIRFLOW CONTROL MODULE-- instead of "MODULAR POWER CONTROL SYSTEM WITH MULTIPIN CONNECTORS AND AIRFLOW CONROL MODULE".

This certificate supersedes the Certificate of Correction issued September 2, 2008.

Signed and Sealed this

Thirtieth Day of September, 2008

JON W. DUDAS
*Director of the United States Patent and Trademark Office*